United States Patent Office 3,076,859

Patented Feb. 5, 1963

3,076,859

THERMOELECTRIC MATERIALS

Claude Herinckx and Georges R. Offergeld, Brussels, and Jean Leon Van Cakenberghe, Beersel, Belgium, assignors to Union Carbide Corporation, a corporation of New York No Drawing. Filed July 10, 1961, Ser. No. 122,630

8 Claims. (Cl. 136—5)

The present invention relates generally to thermoelectric materials, and more particularly, to thermoelectric materials containing bismuth, antimony, and tellurium.

Many thermoelectric materials heretofore proposed have contained bismuth, antimony, and tellurium as major constituents. Most of these compositions have been formed as solid solutions containing bismuth, antimony, and tellurium, in a proportion equal to the stoichiometric compositions of the binary systems $Bi_2Te_3$ and $Sb_2Te_3$, i.e., wherein $$\frac{Bi+Sb}{Te}=\frac{2}{3}$$

In most of these previously proposed thermoelectric Bi-Sb-Te alloys, the thermoelectric power $\alpha$ (Seebeck coefficient) has been between 150 and 250 $\mu$v./° C., the electric conductivity $\sigma$ has been about 2000 ohm$^{-1}$cm.$^{-1}$, and the thermal conductivity K has been about 0.02 watt/cm. ° C. Thus, the figure of merit Z $$\left(Z=\frac{\alpha 2\sigma}{K}\right)$$

of most alloys has been between about $1.5\times10^{-3}$ and about $2.5\times10^{-3}$ per degree centigrade. Also, most previous useful thermoelectric compositions have been p-type materials (materials having a deficiency of electrons), which can be coupled only with n-type materials (materials having a surplus of electrons).

It is, therefore, the main object of the present invention to provide thermoelectric compositions having a figure of merit greater than $2.5\times10^{-3}$ per degree cen igrade.

It is another object of the invention to provide such thermoelectric compositions of p-type and n-type.

Other aims and advantages of the invention will be apparent from the following description and appended claims.

In accordance with the present invention, there is provided a thermoelectric composition consisting essentially of the material characterized by the formula:

$$BiSb_aTe_{1.49+1.47a}$$

and at least one doping element selected from the group consisting of copper, silver, gold, iodine, bromine, chlorine, potassium, sodium, lithium. For p-type materials, $a$ is between about 3.1 and about 4.3 and the doping material is present in an amount between about 0.3 and about 3.0 milligrams per gram of final composition. For n-type materials, $a$ is between about 0.05 and about 0.50 and the doping material is present in an amount between about 0.2 and about 1.0 milligram per gram of final composition.

The inventive compositions have a figure of merit greater than $2.5\times10^{-3}$ per degree centigrade, and usually greater than $3.1\times10^{-3}$ per degree centigrade. Also, the novel thermoelectric composition may be either p-type or n-type, i.e., the composition may have either an excess or a deficiency of electrons. As manifested by the formula $BiSb_aTe_{1.49+1.47a}$, the inventive composition does not contain bismuth, antimony, and tellurium in the stoichiometric $$\frac{Bi+Sb}{Te}$$

ratio of $$\frac{2}{3}$$

The doping material employed in the novel composition is the same for both the p-type and n-type compositions: at least one element selected from the group consisting of copper, silver, gold, iodine, bromine, chlorine, potassium, sodium and lithium. In p-type compositions, the total amount of doping material is between about 0.3 and about 3.0 milligrams per gram of final composition; in n-type compositions, the total amount of doping material is between about 0.2 and about 1.0 milligram per gram of final composition. The doping material need not be added in elemental form, but may be added in combination form, e.g., bismuth iodide.

The present invention stems from the discovery that the particular ternary system Bi-Sb-Te obtained by melting together the congruent melting compositions of both (Bi-Te) and (Sb-Te) behaves itself as single phase solid solution. The congruent melting compositions are those corresponding to the maximum of the liquidus curve of the binary systems formed by melting together bismuth and tellurium on the one hand and antimony and tellurium on the other. These have been found to be non-stoichiometric and are represented by $Bi_{40.065}Te_{59.935}$ and $Sb_{40.4}Te_{59.6}$, respectively. Thus, by melting together these congruent melting compositions along with an eventual doping material, it has been found that one can produce Bi-Sb-Te solid solutions which are not stoichiometric and display attractive thermoelectric properties. The inventive composition can also be produced by melting together elemental Bi, Sb, and Te along with an eventual doping material, in a proportion such that the amount of Bi, Sb, and Te in the solid solution is equivalent to that one would get by combining the aforesaid congruent melting compositions, i.e., in the proportion specified by the general formula given above. In both cases the resulting melt is preferably homogenized by either a zone leveling or seed-pulling technique, such as that described in the co-pending United States patent application Serial No. 50,673, filed August 19, 1960.

The method of preparation described above is useful not only in the preparation of the inventive compositions, but also for the preparation of other solid solutions having semiconductive properties and containing three or more main constituents. For example, a quaternary solid solution ABCD may be prepared by melting together either congruent melting compositions such as (AB), (BC), and (CD), or the constituents A, B, C, and D in elemental form in a proportion such that their relative amounts in the solid are the same as those obtained when the congruent melting compositions are used as starting material.

In a preferred process for producing the novel composition, bismuth, antimony, and tellurium are placed in a quartz ampulla in amounts falling within the relative ranges specified by the aforedescribed formula:

$$BiSb_aTe_{1.49+1.47a}$$

along with an appropriate doping material in an amount falling within the aforedescribed ranges. The starting material should be of the highest possible purity, preferably of spectographic grade (99.999%). The quartz ampulla is evacuated, sealed, and heated until complete melting is achieved. The exact temperature required depends on the composition to be formed and is usually around 600° C. The ampulla is preferably continuously agitated during the melting process to insure homogeneous melting. The resulting melt is cooled down to room temperature and then placed in the inner crucible of a seed-pulling apparatus, such as that described in copending United States patent application Serial No. 50,673, filed August 19, 1960 and entitled, "Apparatus for Growing Solid Homogeneous Compositions." The apparatus described therein comprises an inner crucible containing the molten material to be pulled, a rod for withdrawing the solid composition, a detecting means responsive to any variation in the volume of the molten material, and controlling and compensating means responsive to the detecting means for compensating any variation in the volume of the molten material. The inner crucible is heated to the melting point of the material to be pulled while the surrounding jacket is maintained at about 450° C. in order to reduce the loss of tellurium by evaporation. A seed crystal is dipped into the resulting melt, and a crystalline rod is grown by the usual seed-pulling process. The resulting rod is sliced into small portions of the desired size.

As examples of the inventive materials, several compositions were prepared by the aforedescribed process. The following table gives the formulae of the compositions, the quantity and type of doping material employed in each composition, and the thermoelectric power $\alpha$, the electrical conductivity $\sigma$, and the figure of merit Z for each composition.

*Table*

| Formula of Bi-Sb-Te portion | Mgm of $I_2$ per gm. of final composition | $\alpha$, $\mu$v./° C. (at 30° C.) | $\Omega^{-1}$ cm.$^{-1}$ (at 20° C.) | Z, $10^{-3}$ deg.$^{-1}$ (at 20° C.) |
|---|---|---|---|---|
| $BiSb_{3.29}Te_{6.3}$ | 1 | +158 | 4.100 | 4.6 |
| $BiSb_{4.0}Te_{7.4}$ | 1 | +137 | 3.500 | 3.4 |
| $BiSb_{4.0}Te_{7.4}$ | 1.5 | +146 | 2.600 | 3.4 |
| $BiSb_{0.11}Te_{1.65}$ | 0.5 | −148 | 3.300 | 3.2 |

As can be seen from the formulae given in the table, the first three compositions were p-type, and the fourth composition was n-type. Also, it is clear from the table that both the p-type and n-type compositions had figures of merit greater than $3.0\times10^{-3}$ per degree centigrade, one of the materials having a figure of merit as high as $4.6\times10^{-3}$.

The inventive composition is useful in forming thermocouples for a variety of thermoelectric devices, such as generators and freezers. The thermocouples are formed by coupling the novel composition with any convenient material of opposite sign, i.e., the novel p-type composition may be coupled with any convenient n-type material, and the novel n-type composition may be combined with any convenient p-type material.

While various specific examples have been described herein, it is to be understood that the invention is not limited in its scope to the embodiments described herein, but only as described in the appended claims.

What is claimed is:

1. A thermoelectric composition consisting essentially of the material characterized by the formula $$BiSb_aTe_{1.49+1.47a}$$

wherein $a$ is between about 3.1 and about 4.3, and at least one doping element selected from the group consisting of copper, silver, gold, iodine, bromine, chlorine, potassium, sodium, and lithium, the doping material being present in an amount between about 0.3 and about 3.0 milligrams per gram of final composition.

2. A thermoelectric composition consisting essentially of the material characterized by the formula $$BiSb_aTe_{1.49+1.47a}$$

wherein $a$ is between about 0.05 and about 0.50, and at least one doping element selected from the group consisting of copper, silver, gold, iodine, bromine, chlorine, potassium, sodium, and lithium, the doping material being present in an amount between about 0.2 and about 1.0 milligram per gram of material.

3. A thermoelectric composition as defined in claim 1 wherein said doping material is iodine in an amount between 1.0 and 1.5 milligrams per gram of final composition.

4. A thermoelectric composition as defined in claim 2 wherein said doping material is iodine in an amount of about 0.5 milligram per gram of final composition.

5. A process for producing bismuth-antimony-tellurium thermoelectric material comprising melting together a mixture consisting essentially of the non-stoichiometric congruent-melting binary compositions $Bi_{40.065}Te_{59.935}$ and $Sb_{40.4}Te_{59.6}$, the mole ratio of Sb to Bi being between about 3.1 and about 4.3, with at least one element selected from the group consisting of copper, silver, gold, iodine, bromine, chlorine, potassium, sodium, and lithium in an amount between 0.3 and 3.0 milligrams per gram of final composition.

6. A process for producing bismuth-antimony-tellurium thermoelectric material comprising melting together a mixture consisting essentially of the binary compositions $Bi_{40.065}Te_{59.935}$ and $Sb_{40.4}Te_{59.6}$, the mole ratio of Sb to Bi being between about 0.05 and about 0.50, with at least one element selected from the group consisting of copper, silver, gold, iodine, bromine, chlorine, potassium, sodium, and lithium in an amount between 0.2 and 1.0 milligram per gram of final composition.

7. A process for producing p-type bismuth-antimony-tellurium thermoelectric material comprising melting together bismuth, antimony, and tellurium in elemental form in amounts corresponding to the formula $$BiSb_aTe_{1.49+1.47a}$$

wherein $a$ is between 3.1 and 4.3, with at least one element selected from the group consisting of copper, silver, gold, iodine, bromine, chlorine, potassium, sodium, and lithium, the doping material being present in an amount between 0.3 and 3.0 milligrams per gram of final composition.

8. A process for producing n-type bismuth-antimony-tellurium thermoelectric material comprising melting together bismuth, antimony, and tellurium in elemental form in amounts corresponding to the formula $$BiSb_aTe_{1.49+1.47a}$$

wherein $a$ is between 0.05 and 0.50, with at least one element selected from the group consisting of copper, silver, gold, iodine, bromine, chlorine, potassium, sodium, and lithium, the doping material being present in an amount between 0.2 and 1.0 milligram per gram of final composition.

References Cited in the file of this patent

UNITED STATES PATENTS

| | | |
|---|---|---|
| 2,762,857 | Lindenblad | Sept. 11, 1956 |
| 2,844,638 | Lindenblad | July 22, 1958 |
| 2,990,439 | Goldsmid et al. | June 27, 1961 |

FOREIGN PATENTS

| | | |
|---|---|---|
| 1,064,537 | Germany | Sept. 3, 1959 |
| 1,085,178 | Germany | July 14, 1960 |